United States Patent
Choi et al.

(10) Patent No.: US 12,164,806 B2
(45) Date of Patent: Dec. 10, 2024

(54) SEMICONDUCTOR MEMORY DEVICE AND METHOD OF OPERATING THE SEMICONDUCTOR MEMORY DEVICE

(71) Applicant: SK hynix Inc., Icheon-si Gyeonggi-do (KR)

(72) Inventors: Suk Hwan Choi, Icheon-si Gyeonggi-do (KR); Dong Hun Kwak, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 185 days.

(21) Appl. No.: 17/688,322

(22) Filed: Mar. 7, 2022

(65) Prior Publication Data

US 2023/0112851 A1    Apr. 13, 2023

(30) Foreign Application Priority Data

Oct. 7, 2021  (KR) .................. 10-2021-0133230

(51) Int. Cl.
  *G06F 3/06*  (2006.01)
  *G11C 16/00*  (2006.01)
  *G11C 16/24*  (2006.01)

(52) U.S. Cl.
  CPC .......... *G06F 3/0659* (2013.01); *G06F 3/0604* (2013.01); *G06F 3/064* (2013.01); *G06F 3/0673* (2013.01); *G11C 16/00* (2013.01)

(58) Field of Classification Search
  CPC ...... G06F 3/0659; G06F 3/0604; G06F 3/064; G06F 3/0673; G06F 3/0652; G06F 3/0679; G11C 11/5635; G11C 11/5642; G11C 11/5628; G11C 16/24; G11C 16/349; G11C 16/0483; G11C 16/16; G11C 16/26; G11C 2211/5641; G11C 16/00; H10B 41/35; H10B 41/41; H10B 20/60; H10B 43/35; H10B 43/40
  See application file for complete search history.

(56) References Cited

U.S. PATENT DOCUMENTS

2015/0325303 A1 * 11/2015 Hashimoto ............ G11C 7/14
                                                       365/185.11
2017/0069390 A1 *  3/2017 Nam .................... G11C 16/14

FOREIGN PATENT DOCUMENTS

CN         107305530 A  * 10/2017  ......... G06F 12/0246
KR      1020180032426 A    3/2018
KR         102251815 B1    5/2021

OTHER PUBLICATIONS

Data Storage Device and Operation Method Thereof (Year: 2017).*

* cited by examiner

*Primary Examiner* — Sultana Begum
(74) *Attorney, Agent, or Firm* — WILLIAM PARK & ASSOCIATES LTD.

(57) ABSTRACT

A semiconductor memory device includes a plurality of memory blocks and a contact region. Each of the plurality of memory blocks includes a plurality of memory cells. The contact region is formed between the plurality of memory blocks. The semiconductor memory device uses a first memory block that is not adjacent to the contact region and a second memory block adjacent to the contact region among the plurality of memory blocks differently.

14 Claims, 15 Drawing Sheets

SEMICONDUCTOR MEMORY DEVICE AND METHOD OF OPERATING THE SEMICONDUCTOR MEMORY DEVICE

CROSS-REFERENCE TO RELATED APPLICATION

The present application claims priority under 35 U.S.C. § 119(a) to Korean patent application number 10-2021-0133230 filed on Oct. 7, 2021, in the Korean Intellectual Property Office, the entire disclosure of which is incorporated by reference herein.

BACKGROUND

1. Technical Field

The present disclosure relates to a semiconductor memory device, and more particularly, to a three-dimensional semiconductor memory device and a method of operating the semiconductor memory device.

2. Related Art

A semiconductor memory device may be formed in a two-dimensional structure in which strings are horizontally arranged on a semiconductor substrate, or may be formed in a three-dimensional structure in which the strings are vertically stacked on the semiconductor substrate. A three-dimensional semiconductor memory device is a semiconductor memory device designed to resolve a limit of an integration degree of a two-dimensional memory device, and may include a plurality of memory cells that are vertically stacked on a semiconductor substrate.

SUMMARY

According to an embodiment of the present disclosure, a semiconductor memory device includes a plurality of memory blocks and a contact region. Each of the plurality of memory blocks includes a plurality of memory cells. The contact region is formed between the plurality of memory blocks. The semiconductor memory device uses a first memory block that is not adjacent to the contact region and a second memory block adjacent to the contact region among the plurality of memory blocks differently.

According to another embodiment of the present disclosure, a command for a target memory block among a plurality of memory blocks is received from a memory controller, an operation parameter for performing an operation corresponding to the command is determined, based on a type of the target memory block, and the operation on the target memory block is performed, based on the determined operation parameter, by a method of operating a semiconductor memory device.

According to still another embodiment of the present disclosure, memory blocks that are not adjacent to a contact region are distinguished as first memory blocks among the plurality of memory blocks from memory blocks adjacent to the contact region as second memory blocks, any one of the memory blocks belonging to the second memory blocks is selected as a target memory block, a program-erase count value of the target memory block is checked, and the target memory block is converted into the first memory block when the program-erase count value is greater than a predetermined threshold value, by a method of operating a semiconductor memory device.

According to still another embodiment of the present disclosure, a semiconductor memory device includes a plurality of memory blocks and a contact region. Each of the plurality of memory blocks includes a plurality of memory cells. The contact region is formed between the plurality of memory blocks. A first operation parameter is used for a first operation on a first memory block that is spaced apart from the contact region, and a second operation parameter is used for a second operation on a second memory block adjacent to the contact region. The first operation parameter is different from the second operation parameter, and the first and second operations are the same.

DETAILED DESCRIPTION

Figure 1:
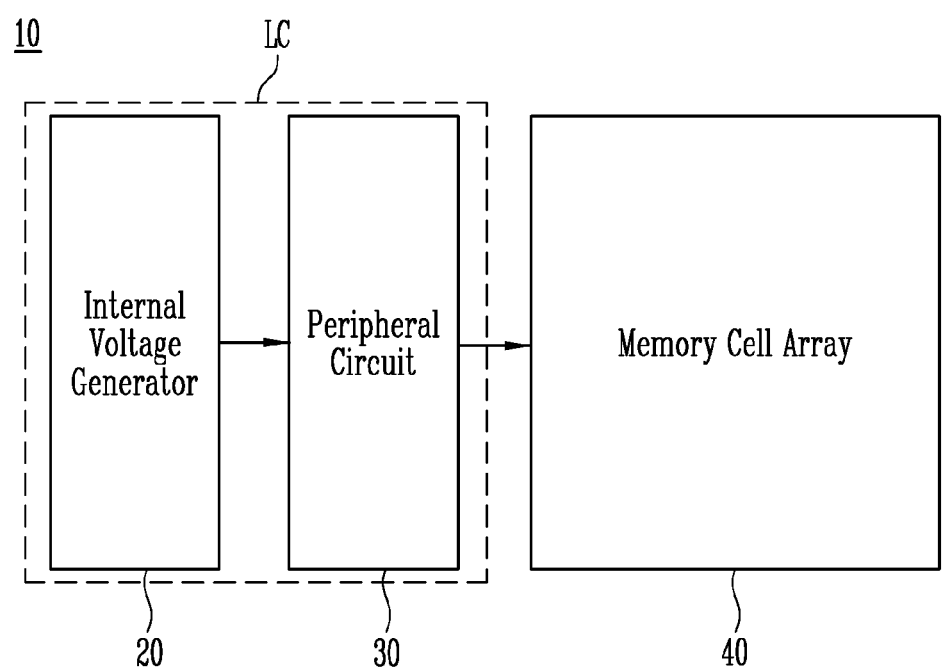
FIG. 1 is a block diagram schematically illustrating a semiconductor memory device 10.

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

It will be understood that although the terms first, second, third etc. may be used herein to describe various elements, these elements should not be limited by these terms. These terms are only used to distinguish one element from another element, but not used to define only the element itself or to mean a particular sequence. It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Spatially relative terms, such as "beneath," "below," "lower," "above," "upper" "under" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example of the term "below" can encompass both an orientation of above and below. The device may be otherwise oriented (rotated 90 degrees or at other orientations) and the spatially relative descriptors used herein interpreted accordingly.

An embodiment of the present disclosure provides a semiconductor memory device and a method of operating the same capable of improving operation performance.

In an embodiment, the semiconductor memory device may include a bit line and a logic circuit. The bit line may be positioned on the plurality of memory blocks and the contact region. The logic circuit may be positioned under the plurality of memory blocks and the contact region.

In an embodiment, the logic circuit may include a peripheral circuit that performs an operation on a selected memory block among the plurality of memory blocks. The peripheral circuit may use a first parameter during the operation when the selected memory block is the first memory block, and use a second parameter different from the first parameter during the operation when the selected memory block is the second memory block.

In an embodiment, the semiconductor memory device may store user data in the first memory block and store system data in the second memory block.

In an embodiment, N bit may be stored in each of the memory cells included in the first memory block, and M bits may be stored in each of the memory cells included in the second memory block. Here, the N may be a natural number greater than 0, and the M may be a natural number greater than the N.

In an embodiment, N bits may be stored in each of the memory cells included in the first memory block, and M bit may be stored in each of the memory cells included in the second memory block. Here, the M may be a natural number greater than 0, and the N may be a natural number greater than the M.

In an embodiment, when a program-erase count value of the second memory block exceeds a predetermined threshold value, the second memory block may be operated using the same operation parameters as the first memory block.

In an embodiment, a contact region may be formed between the plurality of memory blocks. Among the plurality of memory blocks, a memory block that is not adjacent to the contact region may be a first memory block, and a memory block adjacent to the contact region may be a second memory block.

In an embodiment, determining the operation parameter may include checking the type of the target memory block, and selecting a first parameter when the target memory block is the first memory block.

In an embodiment, determining the operation parameter may further include selecting a second parameter different from the first parameter when the target memory block is the second memory block.

In an embodiment, the method may further include maintaining the target memory block as the second memory block when the program-erase count value is not greater than the predetermined threshold value.

Various embodiments may provide a semiconductor memory device and a method of operating the same capable of improving operation performance.

FIG. 1 is a block diagram schematically illustrating a semiconductor memory device 10.

Referring to FIG. 1, the semiconductor memory device 10 includes a logic circuit LC and a memory cell array 40. The logic circuit LC may include an internal voltage generator 20 and a peripheral circuit 30.

The internal voltage generator 20 may be configured to receive an external voltage and generate various internal voltages. As an embodiment, the internal voltages may include an internal ground voltage and an internal power voltage.

The peripheral circuit 30 may be configured to perform a program operation for storing data in the memory cell array 40, a read operation for outputting data stored in the memory cell array 40, and an erase operation for erasing data stored in the memory cell array 40. The internal voltages required to activate the peripheral circuit 30 may be generated from the internal voltage generator 20 and supplied to the peripheral circuit 30.

Figure 2:
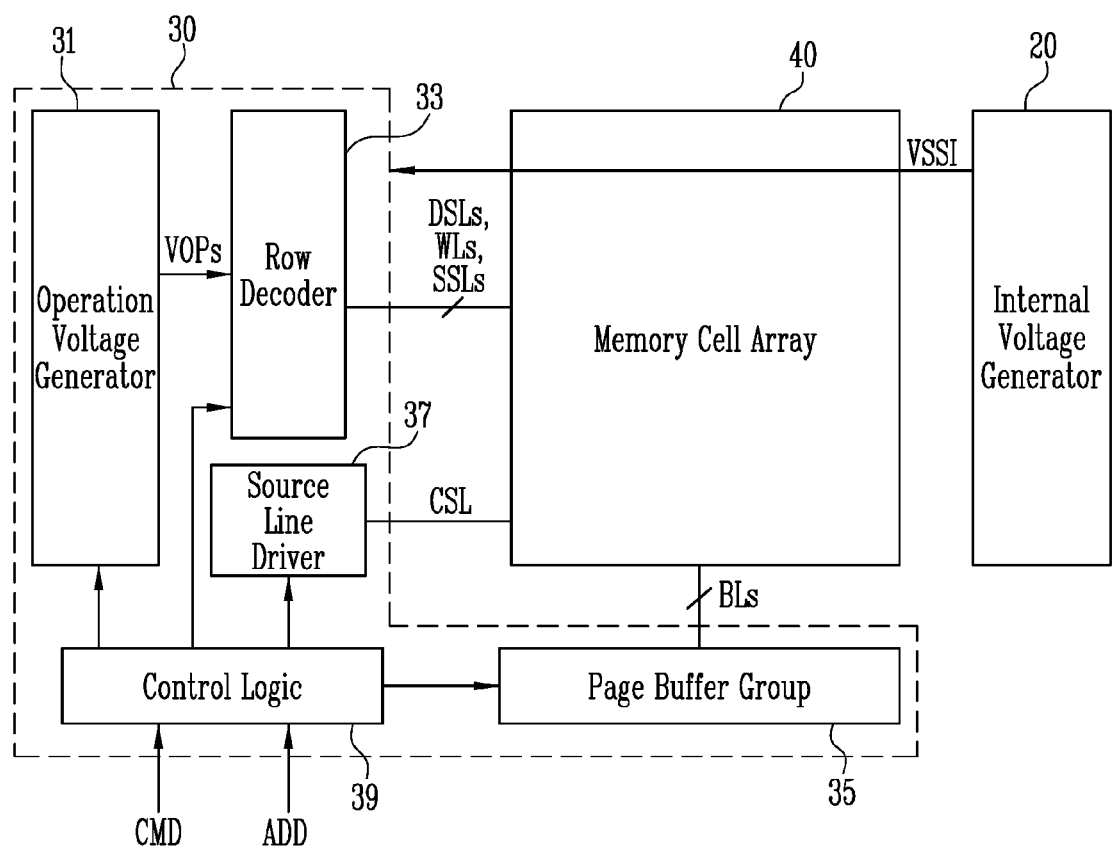
FIG. 2 is a block diagram illustrating an embodiment of a peripheral circuit 30 shown in FIG. 1.

FIG. 2 is a block diagram illustrating an embodiment of the peripheral circuit 30 shown in FIG. 1.

Referring to FIG. 2, the peripheral circuit 30 may include control logic 39, an operation voltage generator 31, a row decoder 33, a source line driver 37, and a page buffer group 35. The control logic 39 may be implemented as hardware, software, or a combination of hardware and software. For example, the control logic 39 may be a control logic circuit operating in accordance with an algorithm and/or a processor executing control logic code.

The memory cell array 40 may include a plurality of memory blocks. Each of the memory blocks may be connected to one or more drain select lines DSLs, a plurality of word lines WLs, one or more source select lines SSLs, a plurality of bit lines BLs, and at least one common source line CSL.

The control logic 39 may control the peripheral circuit 30 in response to a command CMD and an address ADD.

The operation voltage generator 31 may generate various operation voltages VOPs used in the program operation, the read operation, and the erase operation in response to control of the control logic 39. The operation voltages VOPs may include a program voltage, a verify voltage, a pass voltage, a select line voltage, and the like.

The row decoder 33 may select a memory block in response to the control of the control logic 39. The row decoder 33 may be configured to apply the operation voltages VOPs to the drain select lines DSLs, the word lines WLs, and the source select lines SSLs connected to the selected memory block.

The source line driver 37 may be connected to the memory cell array 40 through the common source line CSL. The source line driver 37 may be configured to perform a discharge operation of the common source line CSL in response to the control of the control logic 39. The source line driver 37 may apply a pre-erase voltage and an erase voltage to the common source line CSL during the erase operation in response to the control of the control logic 39.

The page buffer group 35 may be connected to the memory cell array 40 through the bit lines BLs. The page buffer group 35 may temporarily store data, which is to be programmed, received from an input/output circuit (not shown) during the program operation in response to the control of the control logic 39. The page buffer group 35 may sense a voltage or a current of the bit lines BLs during the read operation or the verify operation in response to the control of the control logic 39. The page buffer group 35 may selectively float the bit lines BLs in response to the control of the control logic 39.

The internal voltages output from the internal voltage generator 20 may be supplied to the peripheral circuit 30. As an embodiment, an internal ground voltage VSSI may be output from the internal voltage generator 20. The internal ground voltage VSSI may be supplied to the peripheral circuit 30 via a line overlapping the memory cell array 40.

Figure 3:
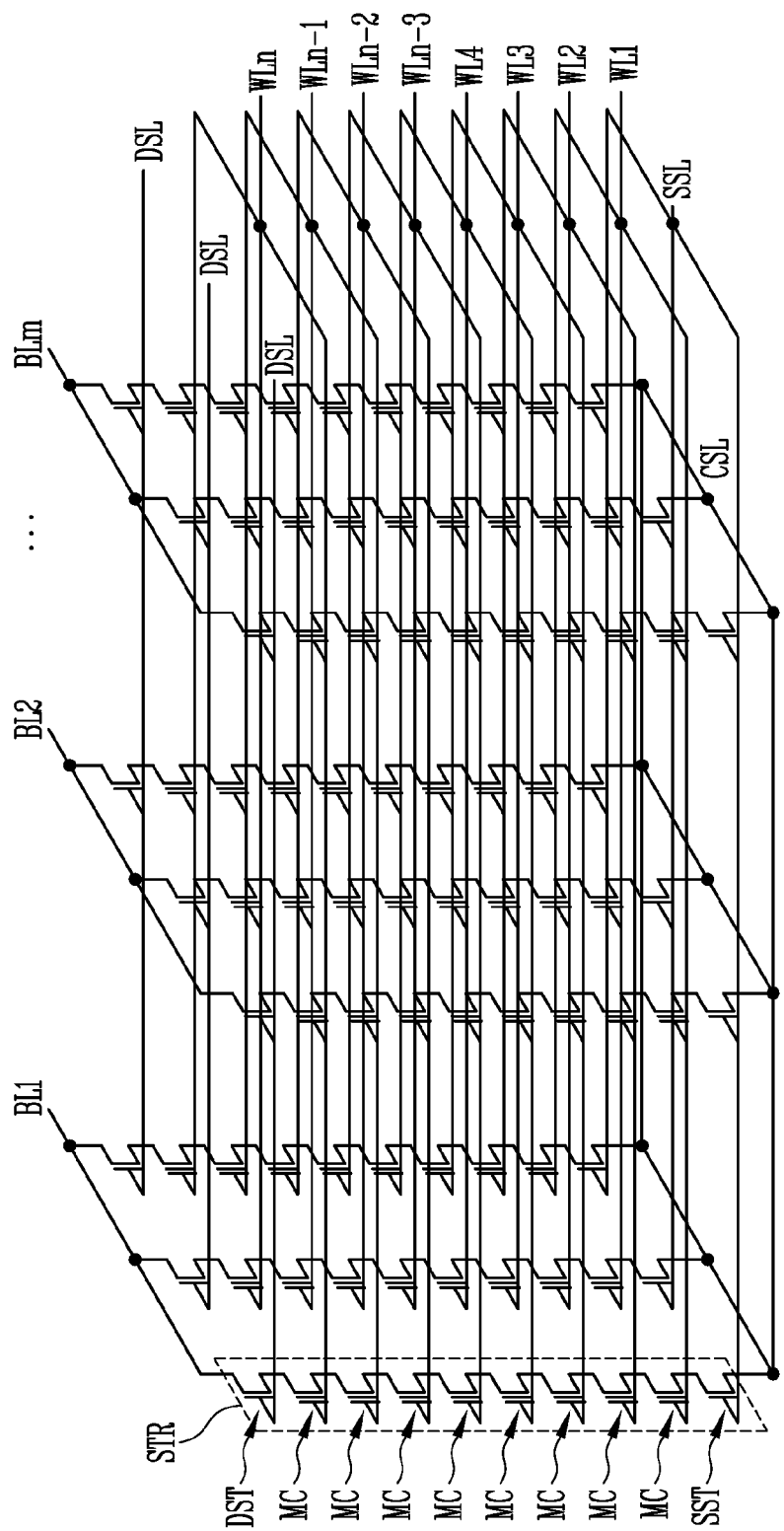
FIG. 3 is an equivalent circuit diagram illustrating a memory block according to an embodiment.

FIG. 3 is an equivalent circuit diagram illustrating a memory block according to an embodiment.

Referring to FIG. 3, the memory block may include a plurality of memory cell strings STR commonly connected to the common source line CSL. The memory cell strings STR may be connected to the plurality of bit lines BL1 to BLm. The memory cell strings STR may be divided into a plurality of column groups respectively connected to the bit lines BL1 to BLm. The memory cell strings STR of each column group may be connected to a corresponding bit line in parallel.

Each of the memory cell strings STR may include one or more drain select transistors, a plurality of memory cells, and one or more source select transistors disposed between a corresponding bit line and the common source line CSL. Gates of each of the drain select transistors may be connected to a drain select line corresponding thereto, gates of each of the memory cells may be connected to a word line corresponding thereto, and gates of each of the source select transistors may be connected to a source select line corresponding thereto.

As an embodiment, each of the memory cell strings STR may be connected to the drain select line DSL, the plurality of word lines WL1 to WLn, and the source select line SSL. In this case, each of the memory cell strings STR may include a drain select transistor DST connected to the drain select line DSL, memory cells MC connected to the word lines WL1 to WLn, and a source select transistor SST connected to the source select line SSL.

The plurality of memory cells MC may be connected in series. The drain select transistor DST may be disposed between the plurality of memory cells MC and a bit line corresponding thereto. The drain select transistor DST may include a junction region connected to a bit line corresponding thereto. The source select transistor SST may be disposed between the plurality of memory cells MC and the common source line CSL. The source select transistor SST may include a junction region connected to the common source line CSL.

A structure of each of the memory cell strings STR is not limited to the embodiment shown in FIG. 3. As an embodiment, each memory cell string STR may include two or more drain select transistors disposed between the plurality of memory cells MC connected in series and a bit line corresponding thereto, and connected in series. In this case, two or more drain select lines may be disposed between the bit lines BL1 to BLm and the word lines WL1 to WLn. As an embodiment, each memory string STR may include two or more source select transistors disposed between the plurality of memory cells MC connected in series and the common source line CSL, and connected in series. In this case, two or more source select lines may be disposed between the common source line CSL and the word lines WL1 to WLn.

As an embodiment, at least one of the word lines WL1 to WLn may be used as a dummy word line. For example, at least one of the word line WL1 adjacent to the source select line SSL or the word line WLn adjacent to the drain select line DSL may be used as the dummy word line.

Figure 4:
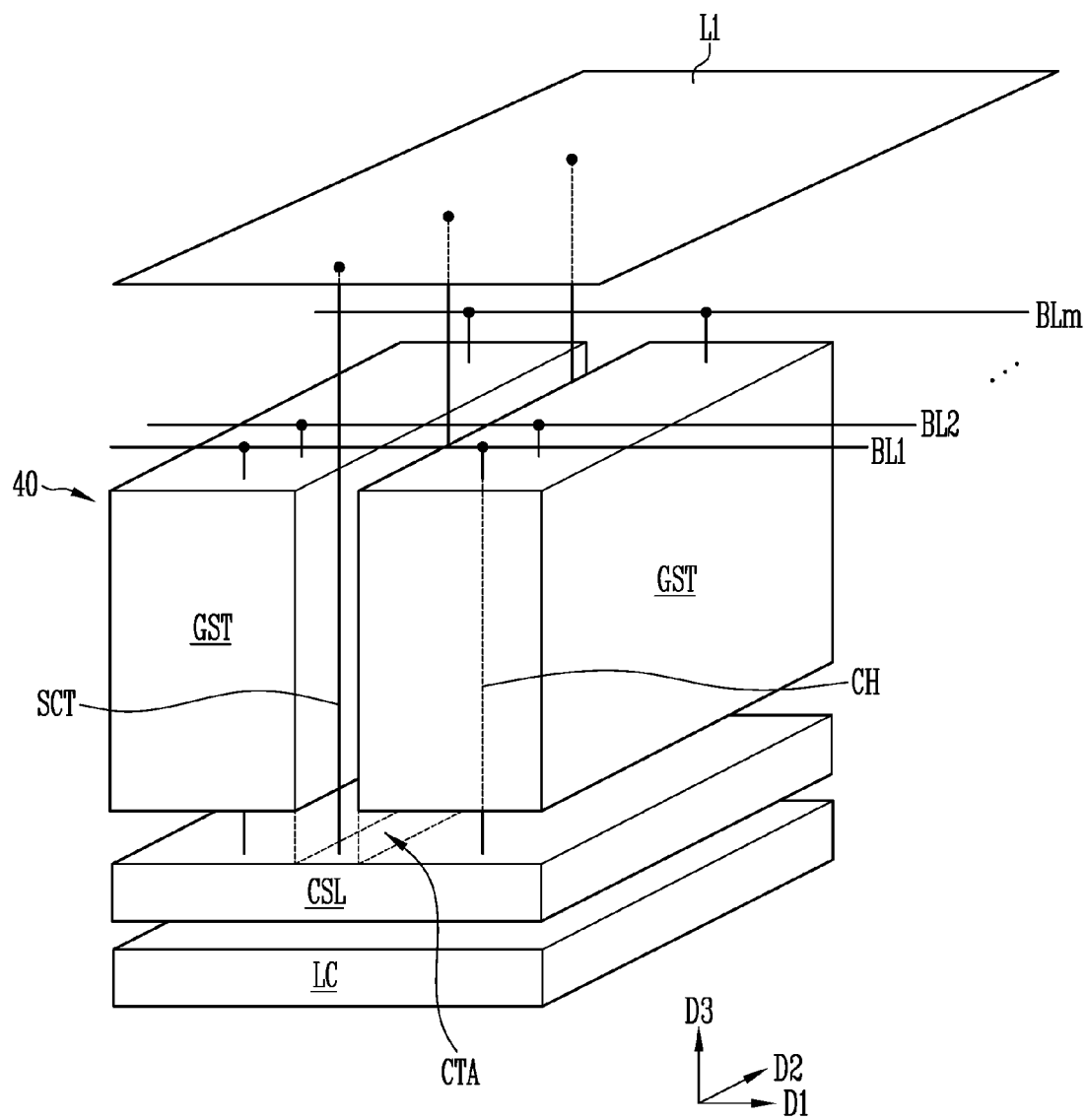
FIG. 4 is a diagram illustrating a conductive layer positioned on a bit line of a memory cell array.

FIG. 4 is a diagram illustrating a conductive layer positioned on a bit line of a memory cell array.

Referring to FIG. 4, the memory cell array 40 may be disposed between the common source line CSL and the bit lines BL1 to BLm. The memory cell array 40 may include gate stacks GST and channel structures CH passing through the gate stacks GST, respectively. The bit lines BL1 to BLm may extend in a first direction D1. Although not shown in FIG. 4, a plurality of word lines may extend in a second direction D2. Meanwhile, the channel structures CH may extend in a third direction D3.

The gate stacks GST may be spaced apart from each other. FIG. 4 shows two gate stacks GST spaced apart from each other with a conductive source contact structure SCT interposed therebetween. In addition to the structure shown in FIG. 4, the memory cell array 40 may include three or more gate stacks GST spaced apart from each other.

Each of the channel structures CH may include one end connected to the common source line CSL and another end connected to a bit line corresponding thereto among the bit lines BL1 to BLm. Each of the channel structures CH and the common source line CSL may be directly connected. Alternatively, a lower channel structure or a contact structure for connecting each of the channel structures CH and the common source line CSL may be formed. Each of the channel structures CH and a bit line corresponding thereto may be directly connected. Alternatively, a contact structure for connecting each of the channel structures CH and a bit line corresponding thereto may be formed.

The channel structures CH may be arranged in a zigzag or matrix form in a gate stack corresponding thereto.

The common source line CSL may be formed on a substrate including the logic circuit LC. The common source line CSL may include a contact region CTA that does not overlap with the gate stacks GST. As an embodiment, the contact region CTA of the common source line CSL may be disposed between the adjacent gate stacks GST. The source contact structure SCT may extend toward an upper conductive layer L1 from the contact region CTA of the common source line CSL.

In an embodiment, as shown in FIG. 4, the upper conductive layer L1 may be used to connect the common source line CSL to the source line driver 37 shown in FIG. 2. Accordingly, a potential level of the common source line CSL may be discharged through the source line driver 37 shown in FIG. 2 via the upper conductive layer L1. In addition, during the erase operation, the erase voltage provided through the source line driver 37 shown in FIG. 2 may be transmitted to the common source line CSL via the upper conductive layer L1. However, an embodiment of the present disclosure is not limited thereto. The upper conductive layer L1 according to an embodiment of the present disclosure might not be connected to the common source line CSL. In this case, the upper conductive layer L1 may be used for a purpose other than a purpose of connecting the common source line CSL to the source line driver 37 shown in FIG. 2. For example, the upper conductive layer L1 may be used as lines connecting the internal voltage generator 20 and the peripheral circuit 30 shown in FIG. 2 to each other.

Meanwhile, in FIG. 4, one upper conductive layer L1 is formed between the bit lines BL1 to BLm. However, the present disclosure is not limited thereto, and a plurality of upper conductive layers disposed in the first direction D1 or the second direction D2 may be formed. In addition, a plurality of upper conductive layers disposed in the third direction D3 may be formed.

The upper conductive layer L1 may include a low resistance metal. The upper conductive layer L1 may include a metal such as copper or aluminum.

Referring to FIG. 4, the common source line CSL is connected to the upper conductive layer through the contact region CTA that does not overlap the gate stacks GST. In another embodiment, the bit lines BL1 to BLm may be connected to the logic circuit LC through the contact region CTA.

Figure 5:
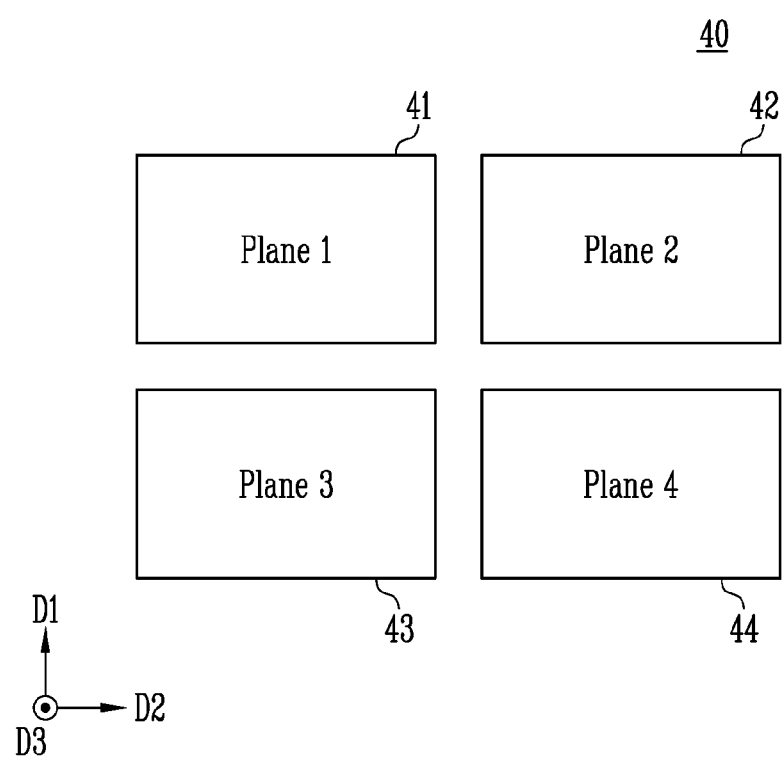
FIG. 5 is a diagram illustrating a plurality of planes included in a memory cell array.

FIG. 5 is a diagram illustrating a plurality of planes included in the memory cell array. Referring to FIG. 5, the memory cell array 40 includes four planes 41 to 44. However, this is an example, and the number of planes included in the memory cell array 40 is not limited thereto. For example, the memory cell array 40 may include two planes or only one plane.

Each of the planes 41 to 44 included in the memory cell array 40 may include a plurality of memory blocks. Meanwhile, each of the planes included in the memory cell array 40 may be formed of the gate stacks GST of FIG. 4.

Figure 6:
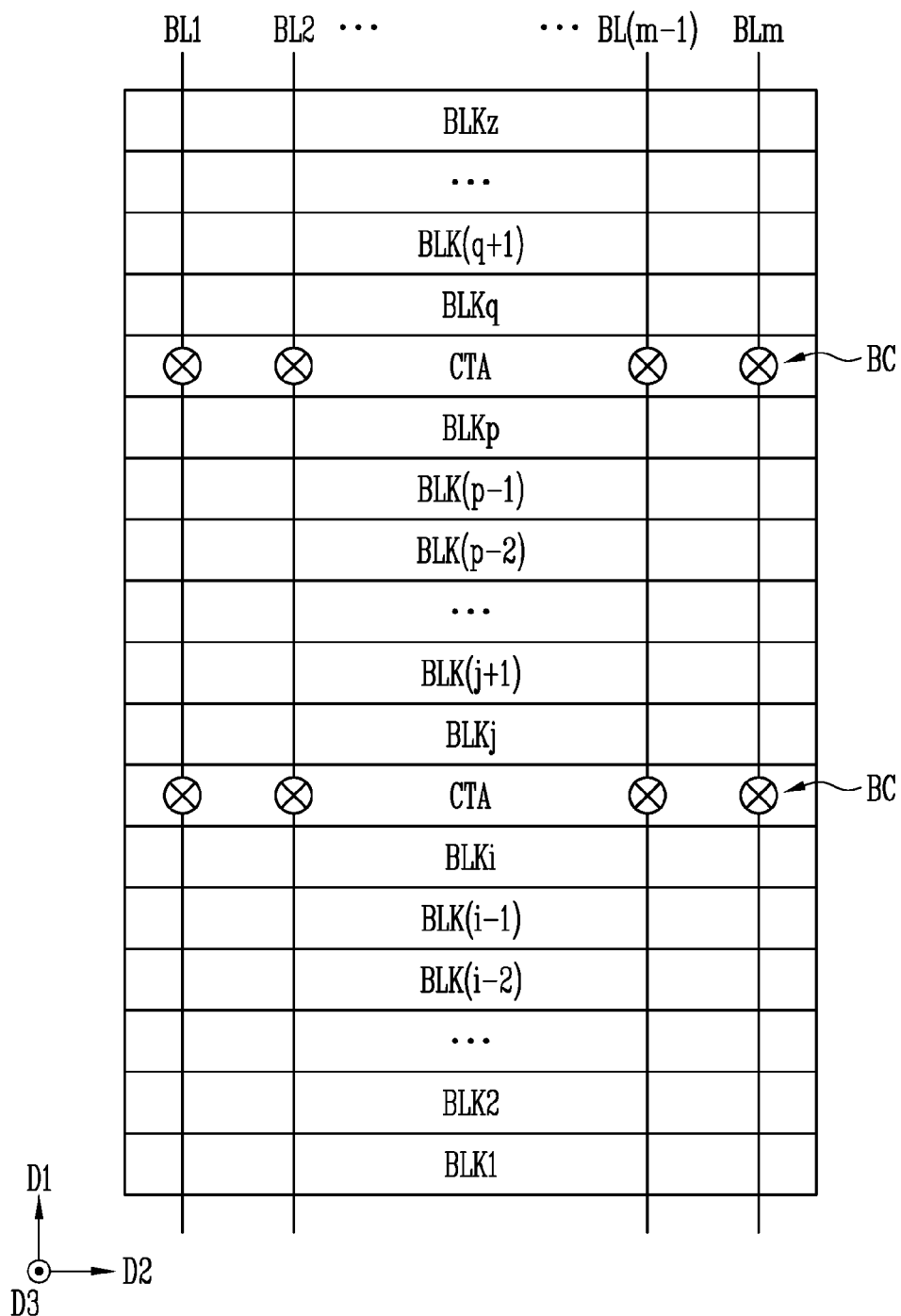
FIG. 6 is a diagram illustrating a disposition of a plurality of memory blocks belonging to a plane.

FIG. 6 is a diagram illustrating a disposition of the plurality of memory blocks belonging to the plane. Referring to FIG. 6, a structure of the plane 41 among the planes 41 to 44 of FIG. 5 is illustrated. However, the other planes 42 to 44 may also have the same structure as the plane 41 of FIG. 5.

Referring to FIG. 6, the plane 41 may include a plurality of memory blocks BLK1 to BLKz. For example, the memory blocks BLK1 to BLKz may be sequentially disposed in the first direction D1. Meanwhile, the bit lines BL1 to BLm may extend in the first direction D1 on the memory blocks BLK1 to BLKz. The bit lines BL1 to BLm may be sequentially disposed in the second direction D2.

The contact region CTA may be formed between the memory blocks BLK1 to BLKz shown in FIG. 6. As shown in FIG. 4, the contact region CTA may be a region between the gate stacks GST. Therefore, in FIG. 6, the first to i-th memory blocks BLK1 to BLKi may form one gate stack GST. In addition, j-th to p-th memory blocks BLKj to BLKp may form one gate stack GST. Meanwhile, q-th to z-th memory blocks BLKq to BLKz may also form one gate stack GST.

A bit line contact BC may be formed in the contact region CTA. The bit line contacts BC may be formed in the contact region CTA to connect the bit lines BL1 to BLm formed on the memory blocks BLK1 to BLKz with the logic circuit LC formed under the memory blocks.

Memory blocks BLK1 to BLK(i−1), BLK(j+1) to BLK(p−1), and BLK(q+1) to BLKz that are not adjacent to the contact region CTA are formed to be surrounded by other memory blocks. Accordingly, the memory blocks BLK1 to BLK(i−1), BLK(j+1) to BLK(p−1), and BLK(q+1) to BLKz that are not adjacent to the contact region CTA are subject to a relatively large interference effect due to coupling from two adjacent memory blocks. On the other hand, memory blocks BLKi, BLKj, BLKp, and BLKq positioned adjacent to the contact region CTA are not surrounded by the memory blocks, differently from other memory blocks. Therefore, the memory blocks BLKi, BLKj, BLKp, and BLKq positioned adjacent to the contact region CTA are subject to a relatively less interference effect due to coupling from other memory blocks. Accordingly, in an embodiment, the memory blocks BLKi, BLKj, BLKp, and BLKq positioned adjacent to the contact region CTA have an excellent cell characteristic as compared to the remaining memory blocks BLK1 to BLK(i−1), BLK(j+1) to BLK(p−1), and BLK(q+1) to BLKz. In an embodiment, memory blocks, for example BLK1 to BLK(i−1), BLK(j+1) to BLK(p−1), and BLK(q+1) to BLKz, that are not adjacent to the contact region may be referred to as memory blocks that are spaced apart from the contact region.

According to the embodiments of the present disclosure, operation conditions, purposes, and the like of the memory blocks BLKi, BLKj, BLKp, and BLKq having an excellent cell characteristic and positioned adjacent to the contact region CTA and the remaining memory blocks BLK1 to BLK(i−1), BLK(j+1) to BLK(p−1), and BLK(q+1) to BLKz are applied differently. Accordingly, according to embodiments of the present disclosure, the memory blocks included in the memory cell array may be efficiently used. As a result, in some embodiments, operation performance of the semiconductor memory device is improved.

Figure 7:
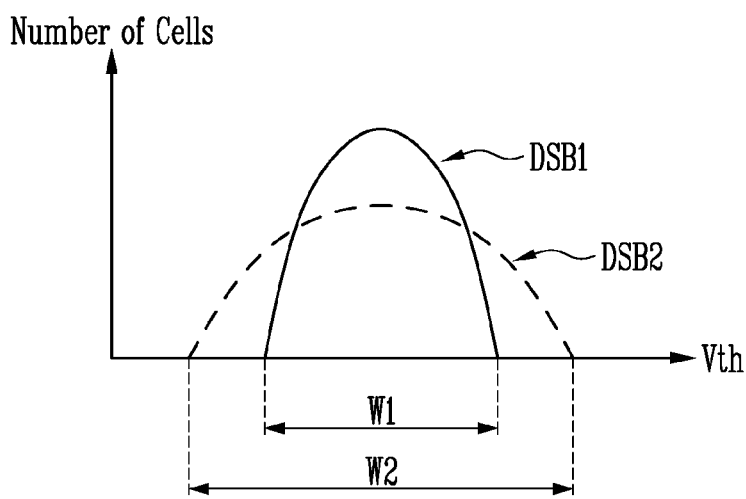
FIG. 7 is a graph illustrating a threshold voltage distribution of memory cells included in the memory blocks of FIG. 6.

FIG. 7 is a graph illustrating a threshold voltage distribution of the memory cells included in the memory blocks of FIG. 6. In the graph of FIG. 7, a horizontal axis indicates a threshold voltage Vth of the memory cell, and a vertical axis indicates the number of memory cells corresponding to each threshold voltage Vth.

Referring to FIG. 7, FIG. 7 shows a threshold voltage distribution DSB1 of the memory cells included in the memory blocks BLKi, BLKj, BLKp, and BLKq positioned adjacent to the contact region CTA and a threshold voltage distribution DSB2 of the memory cells included in the memory blocks BLK1 to BLK(i−1), BLK(j+1) to BLK(p−1), and BLK(q+1) to BLKz that are not adjacent to the contact region CTA, when the program operation is performed under the same condition. The threshold voltage distribution DSB1 of the memory cells included in the memory blocks BLKi, BLKj, BLKp, and BLKq positioned adjacent to the contact region CTA has a first distribution width W1, and the threshold voltage distribution DSB2 of the memory cells included in the memory blocks BLK1 to BLK(i−1), BLK(j+1) to BLK(p−1), and BLK(q+1) to BLKz that are not adjacent to the contact region CTA has a second distribution width W2. Since the first distribution width W1 is narrower than the second distribution width W2, the memory blocks BLKi, BLKj, BLKp, and BLKq positioned adjacent to the contact region CTA may have a relatively excellent operation characteristic in the program operation, the read operation, or the erase operation.

Figure 8:
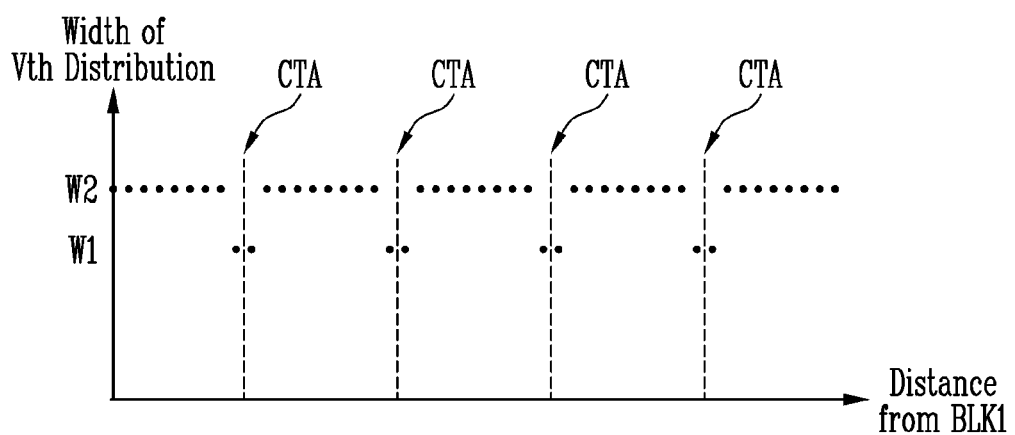
FIG. 8 is a graph illustrating a threshold voltage distribution width of memory blocks adjacent to a contact region and memory cells included in the other memory blocks.

FIG. 8 is a graph illustrating a threshold voltage distribution width of the memory blocks adjacent to the contact region and the memory cells included in the other memory blocks. In the graph of FIG. 8, a horizontal axis indicates a distance from the memory block BLK1, and a vertical axis indicates a width of the threshold voltage distribution of the memory cells included in the memory blocks positioned according to a distance from the memory block BLK1.

Referring to FIG. 8, the contact region CTA may be formed at a position indicated by a dotted line, and a threshold voltage of the memory cells included in the memory blocks positioned adjacent to the contact region CTA may have a first distribution width W1. Threshold voltages of the memory cells included in the memory blocks that are not adjacent to the contact region CTA may have a second distribution width W2 greater than the first distribution width W1. As described above, since the memory blocks positioned adjacent to the contact region CTA and the remaining memory blocks have different threshold voltage distribution characteristics, the operation conditions, the purposes, and the like of the memory blocks positioned adjacent to the contact region CTA and the remaining memory blocks are applied differently. Accordingly, according to embodiments of the present disclosure, the memory blocks included in the memory cell array may be efficiently used. As a result, in some embodiments, the operation performance of the semiconductor memory device is improved.

Figure 9:
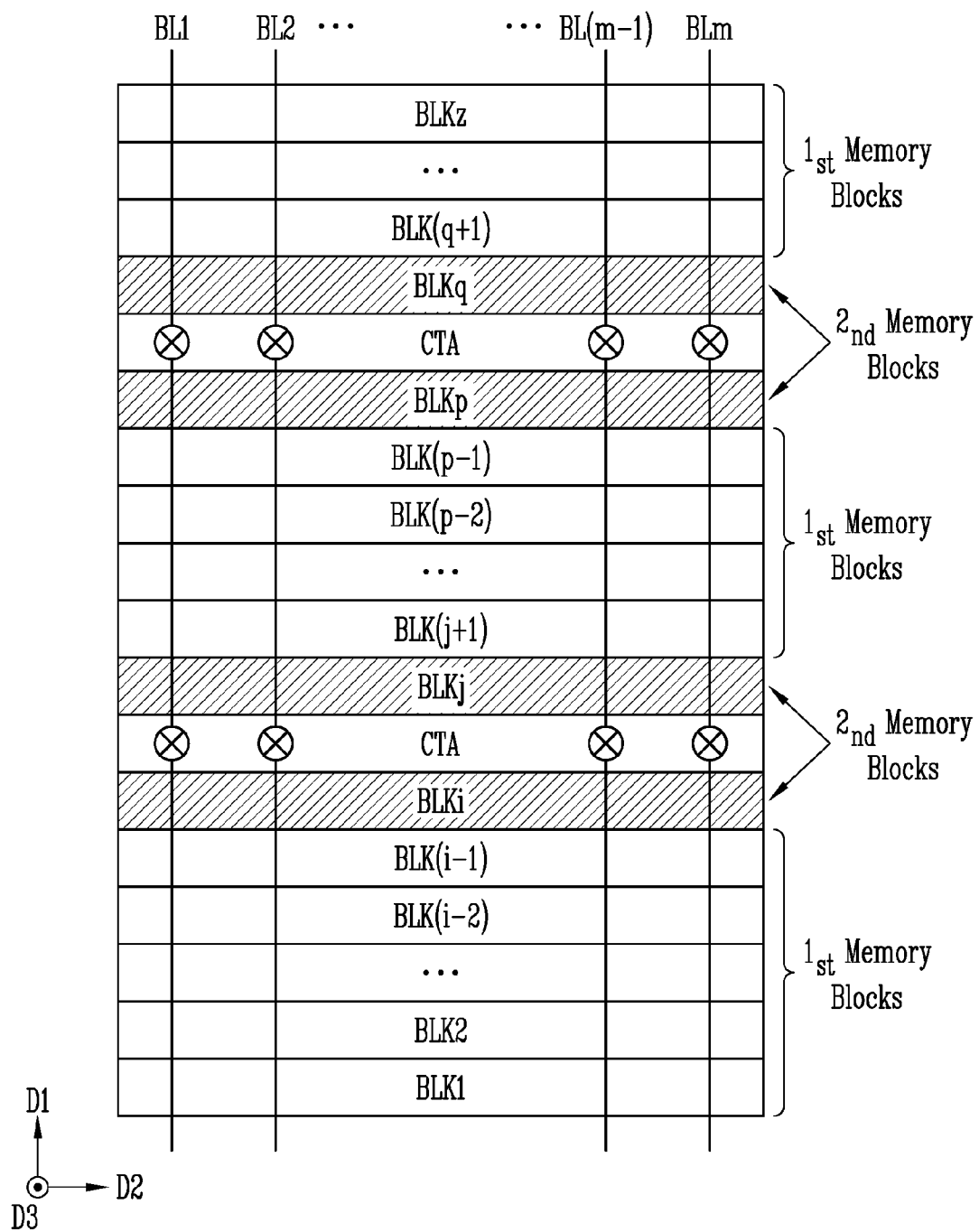
FIG. 9 is a diagram illustrating a semiconductor memory device in which operation conditions of first memory blocks that are not adjacent to a contact region and second memory blocks adjacent to the contact region are differently applied, according to an embodiment of the present disclosure.

FIG. 9 is a diagram illustrating a semiconductor memory device in which operation conditions of first memory blocks that are not adjacent to a contact region and second memory blocks adjacent to the contact region are differently applied, according to an embodiment of the present disclosure.

Referring to FIG. 9, the memory blocks BLK1 to BLKz included in the first plane 41 may be divided into the first memory blocks and the second memory blocks. The first memory blocks BLK1 to BLK(i−1), BLK(j+1) to BLK(p−1), and BLK(q+1) to BLKz are the memory blocks that are not adjacent to the contact region CTA, and the second memory blocks BLKi, BLKj, BLKp, and BLKq are the memory blocks adjacent to the contact region CTA. In FIG. 9, the adjacent memory blocks are indicated by a deviant crease line.

According to an embodiment of the present disclosure, operation parameters used in an operation on the first memory blocks and operation parameters used in an operation on the second memory blocks may be applied differently. The operation may be any one of the program operation, the read operation, or the erase operation. The operation parameters may be any one of parameters used in the program operation, parameters used in the read operation, or parameters used in the erase operation.

For example, in a case of the program operation, the operation parameter may include at least one of a program voltage applied to a selected word line, a program pass voltage applied to an unselected word line, a program allowable voltage applied to a bit line connected to a program allowable cell, a program inhibit voltage applied to a bit line connected to a program inhibit cell, and a verify voltage used in a verify operation. In addition, various parameters used in the program operation may be included in the operation parameter.

As another example, in a case of the read operation, the operation parameter may include at least one of a read voltage applied to the selected word line, a read pass voltage applied to the unselected word line, and a precharge voltage or a precharge time used for precharging the bit line. In addition, various parameters used in the read operation may be included in the operation parameter.

As still another example, in a case of the erase operation, the operation parameter may include at least one of an erase voltage applied through the common source line or the bit line connected to the selected memory block, and an erase verify voltage for checking whether the threshold voltage of the memory cell becomes sufficiently low. In addition, various parameters used in the erase operation may be included in the operation parameter.

As described above, in an embodiment, by differently applying the operation parameters used in the operation on the first memory blocks and the operation parameters used in the operation on the second memory blocks, operation performance of each of the first memory blocks and the second memory blocks may be maximized. An embodiment in which the operation parameters used in the operation for the first memory blocks and the operation parameters used in the operation for the second memory blocks are differently applied is described with reference to FIGS. 10 and 11.

According to another embodiment of the present disclosure, a type of data stored in the first memory blocks and a type of data stored in the second memory blocks may be applied differently. For example, user data may be stored in the first memory blocks including the memory cells having a relatively wide threshold voltage distribution, and system data may be stored in the second memory blocks including the memory cells having a relatively narrow threshold voltage distribution. The user data may be data input to a memory system from outside the memory system. The system data may be data necessary for the operation of the semiconductor memory device. As an example, the system data may include a parameter necessary for the operation of the semiconductor memory device. As another example, the system data may include management information required by an external memory controller to control the operation of the semiconductor memory device. For example, the system data may include a boot code executed when the memory system is booted. As another example, the system data may include meta data for data stored in the semiconductor memory device. For example, the meta data may include mapping data for mapping a logical address-physical address. As another example, the system data may include parity data used for error correction when reading data stored in the semiconductor memory device.

As described above, in an embodiment, by storing the system data necessary for the operation of the semiconductor memory device in the second memory blocks having higher reliability, operation stability of the semiconductor memory device may be improved. An embodiment in which the type of the data stored in the first memory blocks and the type of the data stored in the second memory blocks are applied differently is described with reference to FIG. 12.

According to still another embodiment of the present disclosure, the number of bits stored in each of the memory cells included in the first memory blocks and the number of bits stored in each of the memory cells included in the second memory blocks may be applied differently. As an example, the memory blocks may be used so that the number of bits stored in the memory cells included in the second memory blocks is less than the number of bits stored in the memory cells included in the first memory blocks. As another example, the memory blocks may be used so that the number of bits stored in the memory cells included in the second memory blocks is greater than the number of bits stored in the memory cells included in the first memory blocks. An embodiment in which the number of bits stored in each of the memory cells included in the first memory blocks and the number of bits stored in each of the memory cells included in the second memory blocks are applied differently is described with reference to FIGS. 13 and 14.

According to still another embodiment of the present disclosure, among the memory blocks positioned adjacent to the contact region CTA and thus determined as the second memory blocks, a memory block of which a program-erase count exceeds a predetermined criterion may be converted into the first memory block. Since the second memory blocks are positioned adjacent to the contact region CTA, a threshold voltage distribution characteristic of the memory cells may be relatively satisfactory, but the threshold voltage distribution characteristic of the memory cells may be gradually deteriorated as the number of times the second memory blocks are used is accumulated. Therefore, among the second memory blocks, the memory block of which the program-erase count exceeds the predetermined criterion may be converted into the first memory block and used. An embodiment in which the second memory block of which the program-erase count exceeds the predetermined criterion is converted into the first memory block is described with reference to FIG. 15. The word "predetermined" as used herein with respect to a parameter, such as a predetermined criterion and predetermined threshold value, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Figure 10:
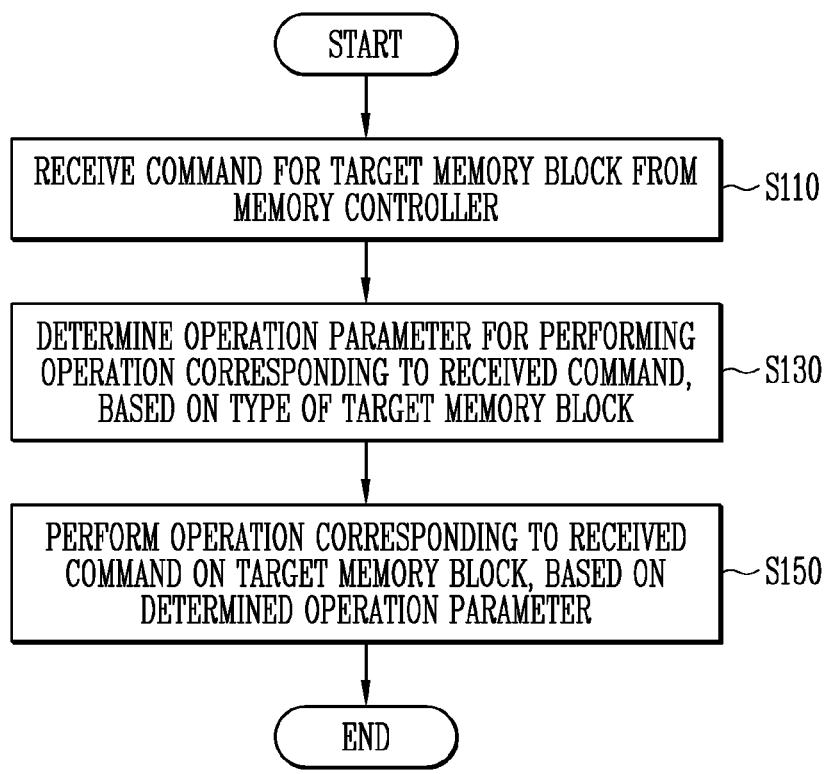
FIG. 10 is a flowchart illustrating a method of operating a semiconductor memory device according to an embodiment of the present disclosure.

FIG. 10 is a flowchart illustrating a method of operating a semiconductor memory device according to an embodiment of the present disclosure.

Referring to FIG. 10, the method of operating the semiconductor memory device according to an embodiment of the present disclosure includes receiving a command for a target memory block from a memory controller (S110), determining an operation parameter for performing an operation corresponding to the received command, based on a type of the target memory block (S130), and performing the operation corresponding to the received command on the target memory block, based on the determined operation parameter (S150).

In step S110, the semiconductor memory device may receive, from the memory controller, a command instructing to perform a specific operation and an address identifying the target memory block that is an object of the operation corresponding to the received command. For example, the semiconductor memory device may receive a program command and an address corresponding thereto. The semiconductor memory device determines the target memory block based on the received address.

In step S130, the operation parameter used for performing the operation corresponding to the received command on the identified target memory block may be determined. That is, in step S130, the operation parameter is determined according to whether the target memory block is the first memory block or the second memory block shown in FIG. 9. Step S130 is described with reference to FIG. 11.

In step S150, the operation for the received command may be performed on the target memory block using the determined operation parameter.

Figure 11:
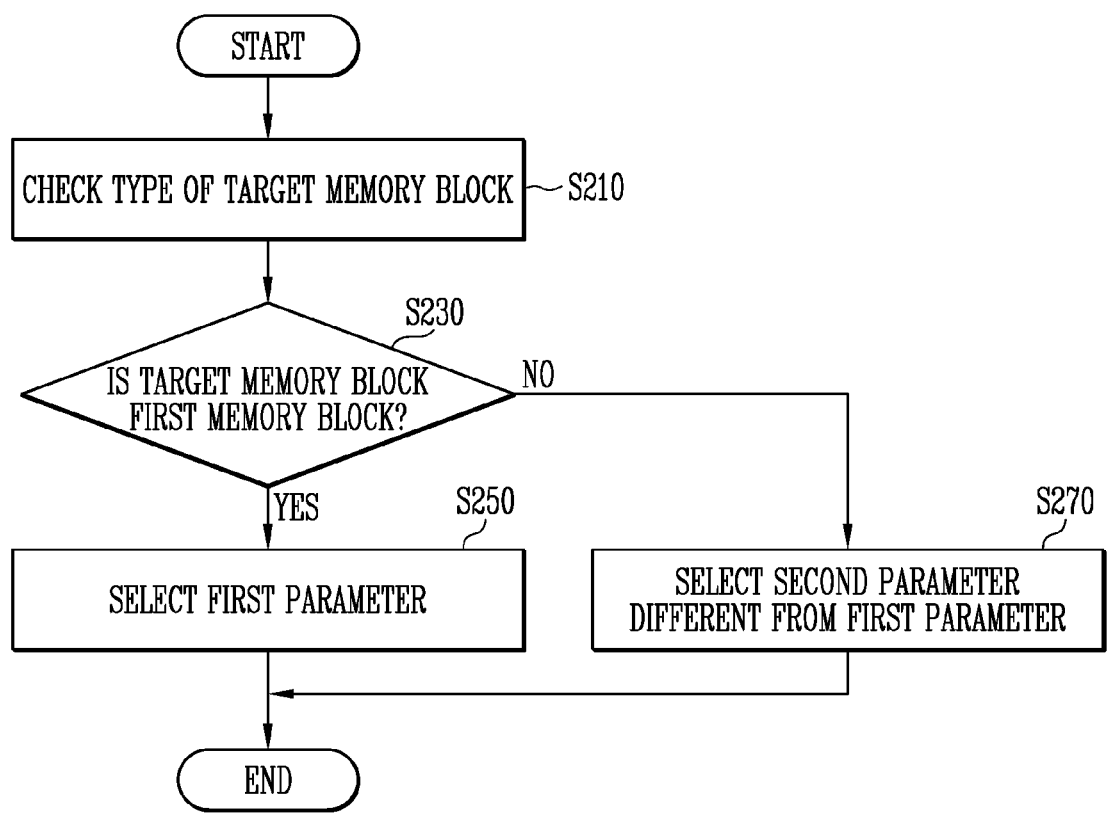
FIG. 11 is a flowchart illustrating an embodiment of step S130 of FIG. 10.

FIG. 11 is a flowchart illustrating an embodiment of step S130 of FIG. 10.

Referring to FIG. 11, step S130 includes checking the type of the target memory block (S210) and determining whether the target memory block is the first memory block (S230). Meanwhile, step S130 may further include selecting a first parameter when the target memory block is the first memory block (S230: Yes). On the other hand, step S130 may further include selecting a second parameter different from the first parameter when the target memory block is the second memory block (S230: No).

In step S210, the control logic 39 of the semiconductor memory device 10 determines whether the target memory block is the first memory block or the second memory block based on the address received together with the command. To this end, the semiconductor memory device 100 may store information for identifying the first memory block and the second memory block.

As a result of the determination of step S230, when the target memory block is the memory block that is not adjacent to the contact region CTA, that is, the first memory block (S230: Yes), the first parameter is selected as the operation parameter (S250). The selected first parameter may be used in an operation performed on the target memory block in step S150 of FIG. 10.

As a result of the determination of step S230, when the target memory block is the memory block positioned adjacent to the contact region CTA, that is, the second memory block (S230: No), the second parameter different from the first parameter is used as the operation parameter (S270). The selected second parameter may be used in the operation performed on the target memory block in step S150 of FIG. 10.

For example, when the command received in step S110 of FIG. 10 is the program command, the first parameter and the second parameter of FIG. 11 may be parameters related to the program operation. As an example, the first and second parameters may indicate a magnitude of the program voltage applied to the word line connected to the memory cells selected as a program target. In this case, the magnitude of the program voltage used in the program operation may vary according to whether the target memory block is the first memory block or not. As another example, the first and second parameters may indicate at least one of a magnitude of the program pass voltage, a magnitude of the program allowable voltage, a magnitude of the program inhibit voltage, and a magnitude of a verify voltage. In addition, the first and second parameters may indicate various values used in the program operation.

As another example, when the command received in step S110 of FIG. 10 is the read command, the first parameter and the second parameter of FIG. 11 may be parameters related to the read operation. As an example, the first and second parameters may indicate a magnitude of the read voltage applied to the word line connected to the memory cells selected as a read target. In this case, the magnitude of the read voltage applied to the selected word line during data read may vary according to whether the target memory block is the first memory block or not. As another example, the first and second parameters may indicate at least one of the magnitude of the read pass voltage, a magnitude of the bit line precharge voltage, and length of the bit line precharge time. In addition, the first and second parameters may indicate various values used in the read operation.

As still another example, when the command received in step S110 of FIG. 10 is the erase command, the first parameter and the second parameter of FIG. 11 may be parameters related to the erase operation. As an example, the first and second parameters may indicate the erase voltage applied to the common source line connected to the memory block selected as an erase target. As another example, the first and second parameters may indicate at least one of a voltage applied to the bit line connected to the memory block selected as the erase target, or the erase verify voltage. In addition, the first and second parameters may indicate various values used in the erase operation.

As described above, in an embodiment, by differently applying the operation parameters used in the operation on the first memory blocks and the operation parameters used in the operation on the second memory blocks, operation performance of each of the first memory blocks and the second memory blocks may be maximized.

Figure 12:
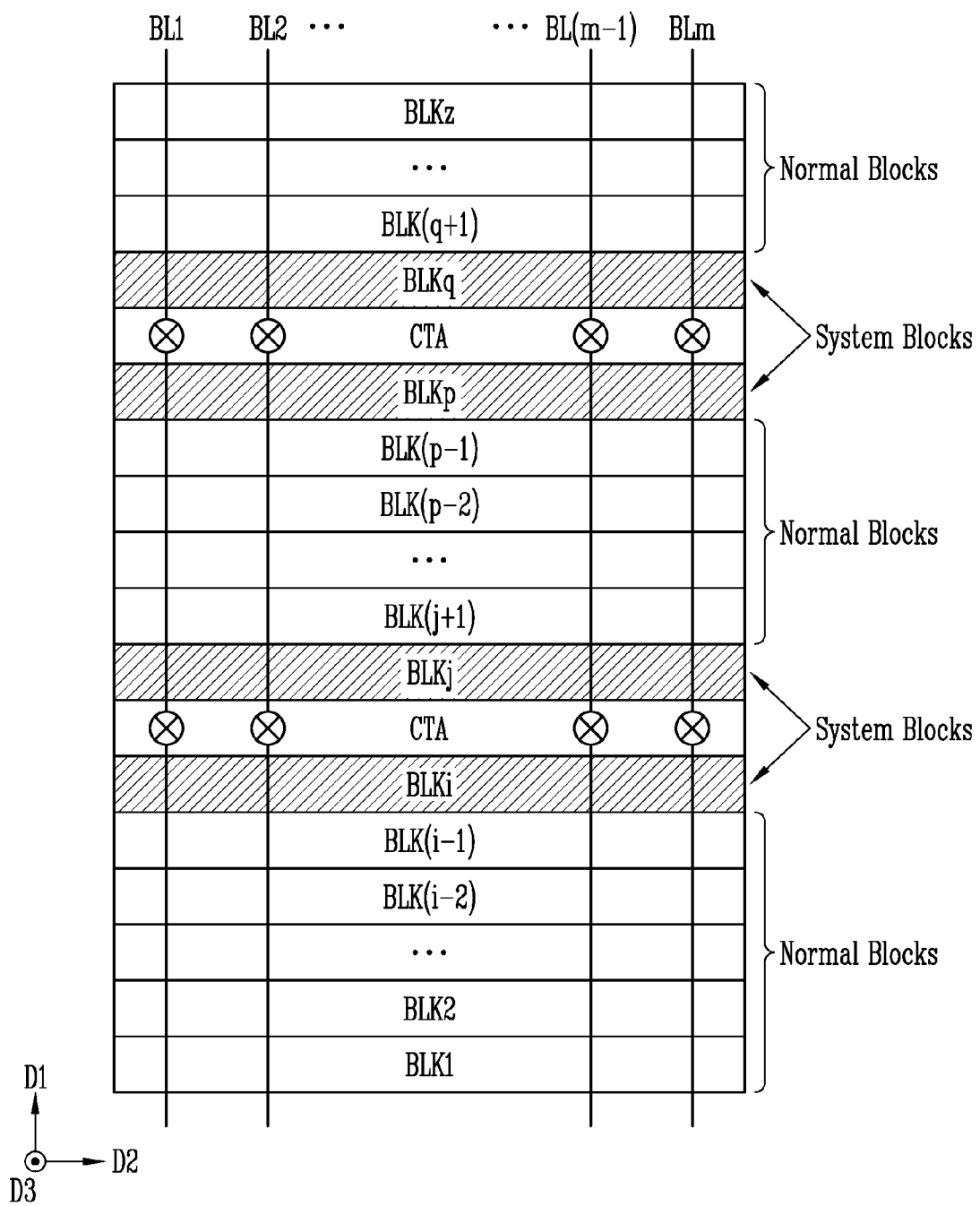
FIG. 12 is a diagram illustrating a method of differently applying purposes of first memory blocks and second memory blocks according to another embodiment of the present disclosure.

FIG. 12 is a diagram illustrating a method of differently applying purposes of first memory blocks and second memory blocks according to another embodiment of the present disclosure.

Referring to FIG. 12, the semiconductor memory device according to an embodiment of the present disclosure may use the memory block in which the target memory block is not adjacent to the contact region CTA, that is, the first memory block as a normal block, and use the memory block in which the target memory block is adjacent to the contact region CTA, that is, the second memory block as a system block. According to an embodiment of the present disclosure, types of data stored in the normal block and the system block are different.

For example, the first memory blocks including the memory cells having a relatively wide threshold voltage distribution width may be used as the normal block for storing the user data. Meanwhile, the second memory blocks including the memory cells having a relatively narrow threshold voltage distribution width may be used as the system block for storing the system data.

As described above, the user data may be the data input to the memory system from outside the memory system. Meanwhile, the system data is the data necessary for the operation of the semiconductor memory device, and may include the operation parameters necessary for the operation of the semiconductor memory device, and the management information required by the memory controller to control the operation of the semiconductor memory device. For example, the system data may include any one of a boot code, meta data, mapping data, and parity data.

As described above, in an embodiment, by storing the system data necessary for the operation of the semiconductor memory device in the second memory blocks having higher reliability, the operation stability of the semiconductor memory device may be improved.

Figure 13:
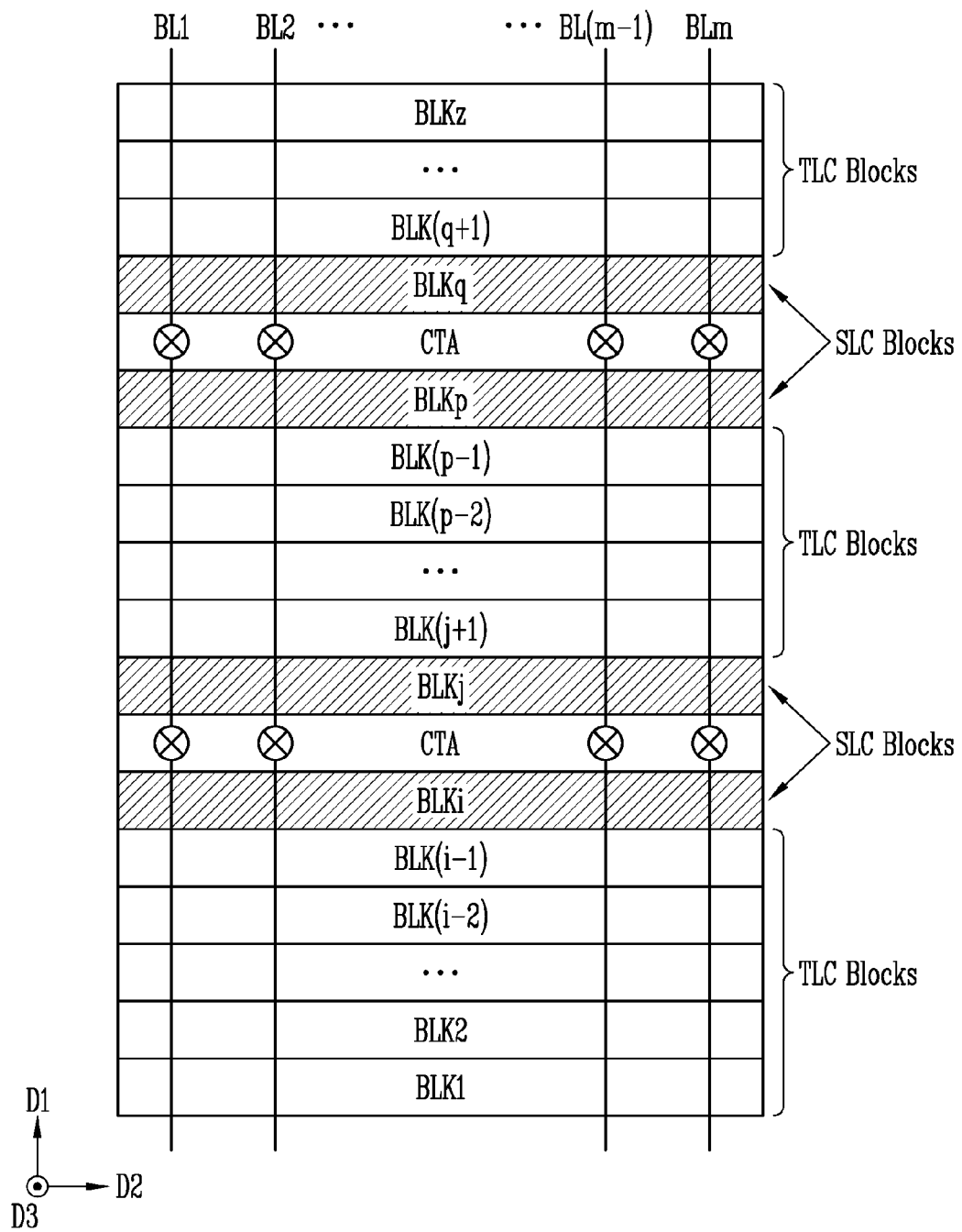
FIG. 13 is a diagram illustrating a semiconductor memory device in which the number of bits stored in memory cells included in second memory blocks is relatively less than the number of bits stored in memory cells included in first memory blocks, according to still another embodiment of the present disclosure.

FIG. 13 is a diagram illustrating a semiconductor memory device in which the number of bits stored in memory cells included in second memory blocks is relatively less than the number of bits stored in memory cells included in first memory blocks, according to still another embodiment of the present disclosure.

Referring to FIG. 13, the semiconductor memory device according to an embodiment of the present disclosure may use the memory block in which the target memory block is not adjacent to the contact region CTA, that is, the first memory block as a triple-level cell (TLC) block, and use the memory block in which the target memory block is positioned adjacent to the contact region CTA, that is, the second memory block as a single-level cell (SLC) block. Accordingly, three bits of data may be stored in the memory cells included in the first memory block, and one bit of data may be stored in the memory cells included in the second memory block. That is, the number of bits stored in the memory cells included in the second memory blocks is relatively less than the number of bits stored in the memory cells included in the first memory blocks. In this case, in an embodiment, by allowing a less number of bits to be stored in the memory cells of the second memory blocks of which a distribution characteristic is relatively satisfactory, the operation performance may be further improved. As a result, in an embodiment, the second memory blocks may operate at a higher speed than the first memory blocks, and data reliability of the second memory blocks is also higher than that of the first memory blocks.

By utilizing such a characteristic, the second memory blocks may be used as an SLC buffer of the semiconductor memory device. When the second memory block is used as the SLC buffer, data to be stored in the first memory block is firstly programmed to the second memory block temporarily, and then the data of the second memory block is migrated to the first memory block. As described above, in an embodiment, when the second memory block is used as the SLC buffer, a speed of the program operation using the SLC buffer may be improved.

Meanwhile, the embodiment of FIG. 13 may be used in combination with the embodiment of FIG. 12. That is, by using the second memory blocks as the SLC blocks, the system data may be stored in the second memory block. In this case, in an embodiment, high reliability of the system data may be obtained, and a program and read speed of the system data may be dramatically improved.

Figure 14:
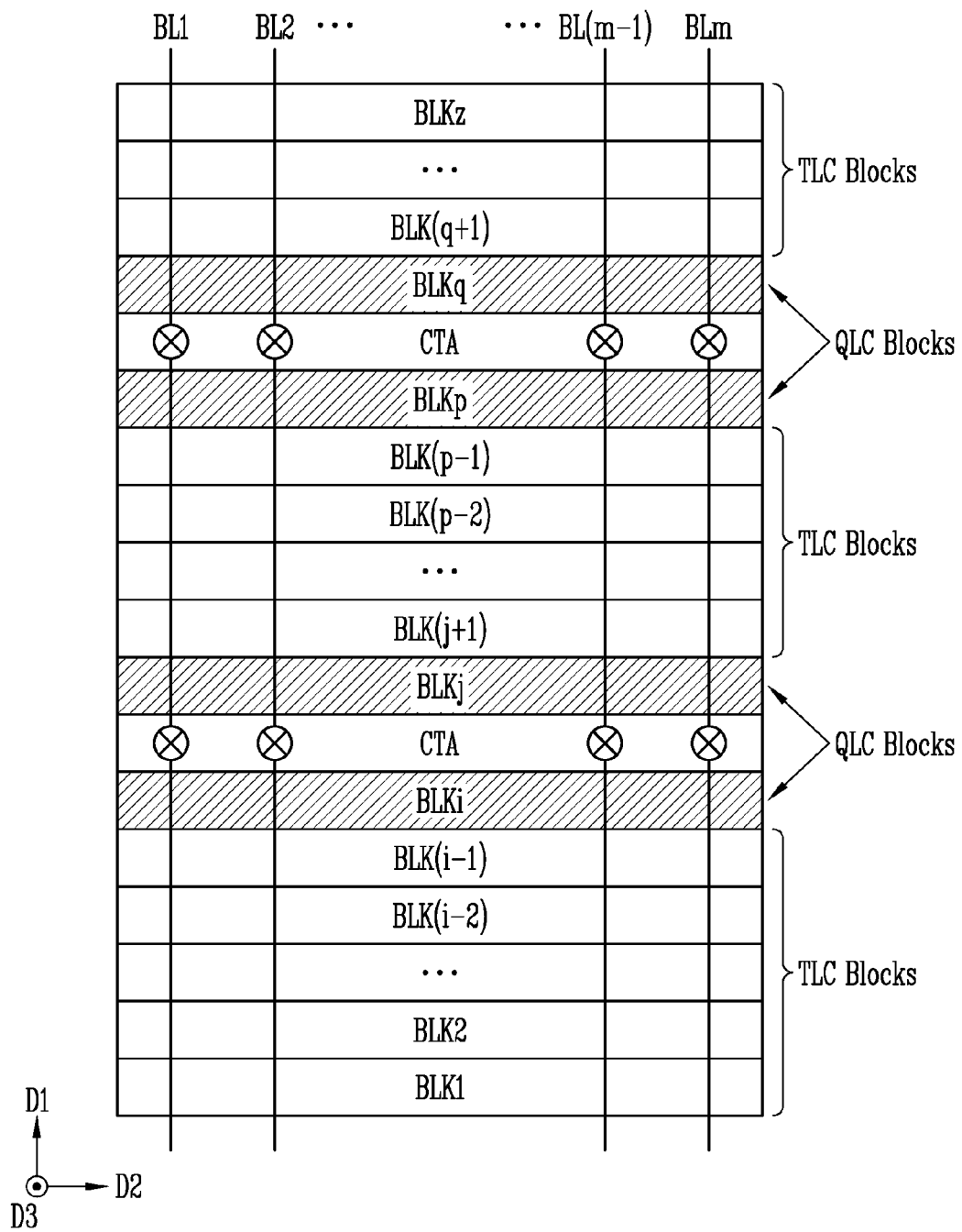
FIG. 14 is a diagram illustrating a semiconductor memory device in which the number of bits stored in memory cells included in second memory blocks is relatively greater than the number of bits stored in memory cells included in first memory blocks, according to still another embodiment of the present disclosure.

FIG. 14 is a diagram illustrating a semiconductor memory device in which the number of bits stored in memory cells included in second memory blocks is relatively greater than the number of bits stored in memory cells included in first memory blocks, according to still another embodiment of the present disclosure.

Referring to FIG. 14, the semiconductor memory device according to an embodiment of the present disclosure may use the memory block in which the target memory block that is not adjacent to the contact region CTA, that is, the first memory block as the TLC block, and use the memory block in which the target memory block is positioned adjacent to the contact region CTA, that is, the second memory block as a quad-level cell (QLC) block. Accordingly, three bits of data may be stored in the memory cells included in the first memory block, and four bits of data may be stored in the memory cells included in the second memory block. That is, the number of bits stored in the memory cells included in the second memory blocks is relatively greater than the number of bits stored in the memory cells included in the first memory blocks. In this case, while a larger number of bits are stored in the memory cells of the second memory blocks of which the distribution characteristic is relatively satisfactory, operation stability similar to that of the first memory block may be secured. As a result, in an embodiment, a storage space of the semiconductor memory device may be maximally secured.

Figure 15:
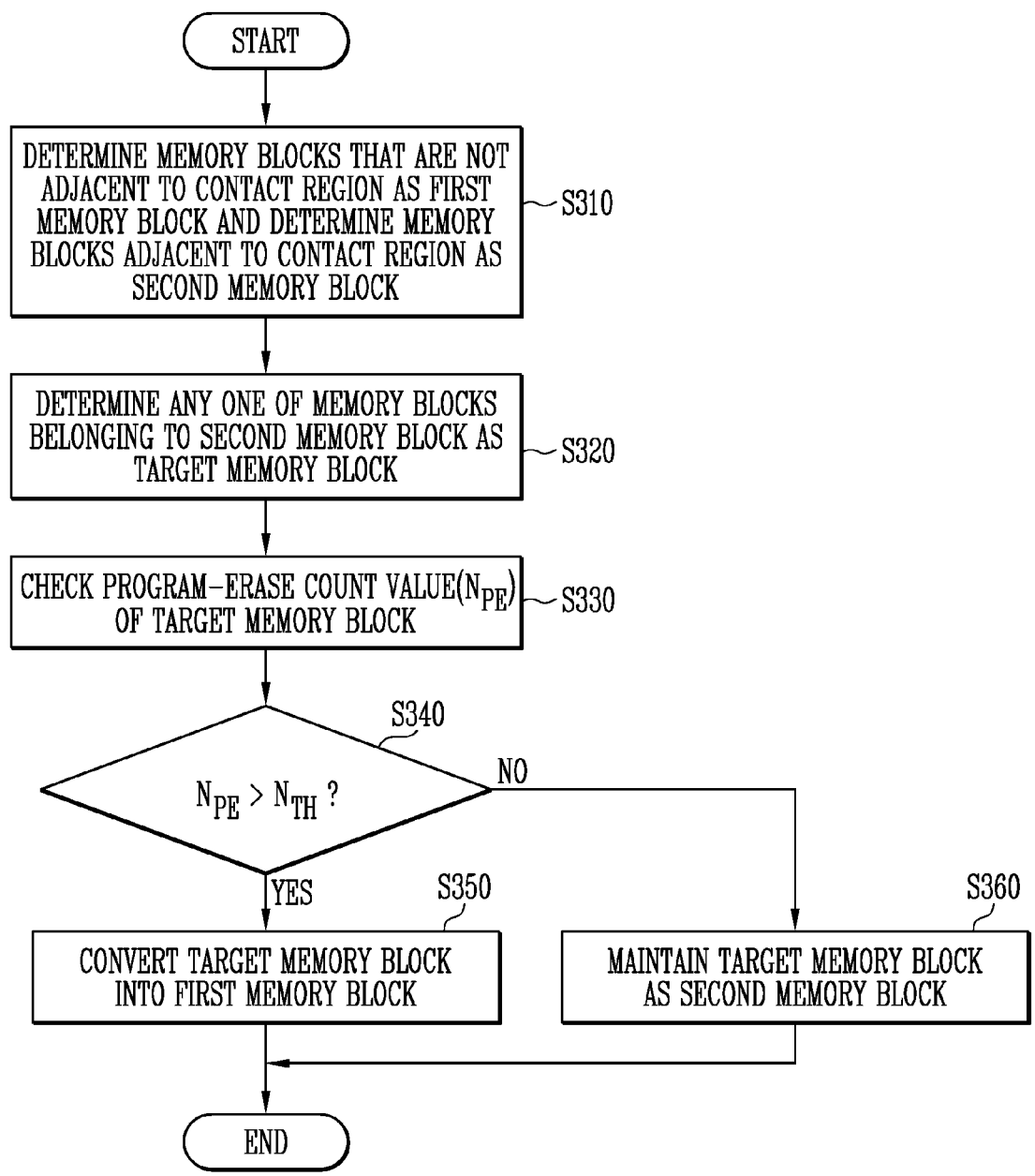
FIG. 15 is a flowchart illustrating a method of operating a semiconductor memory device according to still another embodiment of the present disclosure.

FIG. 15 is a flowchart illustrating a method of operating a semiconductor memory device according to still another embodiment of the present disclosure.

Referring to FIG. 15, the method of operating the semiconductor memory device according to still another embodiment of the present disclosure may include determining the memory blocks that are not adjacent to the contact region CTA as the first memory block and determining the memory blocks adjacent to the contact region CTA as the second memory block (S310), determining any one of the memory blocks belonging to the second memory block as the target memory block (S320), checking a program-erase count value $N_{PE}$ of the target memory block (S330), and determining whether the program-erase count value $N_{PE}$ is greater than a predetermined threshold value $N_{TH}$. Meanwhile, the method of operating the semiconductor memory device according to still another embodiment of the present disclosure may further include converting the target memory block from the second memory block into the first memory block (S350) when the program-erase count value $N_{PE}$ is greater than the predetermined threshold value $N_{TH}$ (S340: Yes). In addition, the method of operating the semiconductor memory device according to still another embodiment of the present disclosure may further include maintaining the target memory block as the second memory block (S360) when the program-erase count value $N_{PE}$ is not greater than the predetermined threshold value $N_{TH}$ (S340: No).

In an embodiment, step S310 may be performed when the memory system including the semiconductor memory device 10 is turned on. In another embodiment, step S310 may be performed immediately after the semiconductor memory device 10 is manufactured. In step S310, as shown in FIG. 9, the memory blocks that are not adjacent to the contact region CTA are determined as the first memory block, and the memory blocks adjacent to the contact region CTA are determined as the second memory block. After step S310 is performed, the information identifying the first memory block and the second memory block may be generated. The information may be stored in the semiconductor memory device 10 or in a memory controller outside the semiconductor memory device 10. In some embodiments, a memory block that is not adjacent to the contact region CTA may initially be determined as the second memory block and a memory block that is adjacent to the contact region CTA may initially be determined as the first memory block. Thus, in some embodiments, a memory block may be arbitrarily determined as one of the first and second memory block regardless of its physical location with respect to the contact region CTA.

Step S320 may be performed when the memory controller transmits a specific command to the semiconductor memory device 10. In this case, when the memory block that is an object of the specific command corresponds to the second memory block, the memory block may be determined as the target memory block. That is, when a specific operation, for example, the erase operation, the program operation, or the read operation is performed on the second memory block, the selected second memory block may be determined as the target block to determine whether the target memory block is converted into the first memory block.

As another embodiment, step S320 may be periodically performed regardless of the command. In this case, step S320 may be performed on the second memory blocks when the semiconductor memory device 10 is in an idle state. That is, in an idle time of the semiconductor memory device 10, a monitoring operation may be sequentially performed on the second memory blocks. It may be determined whether each of the second memory blocks included in the semiconductor memory device 10 is converted into the first memory block, by the monitoring operation.

In step S330, the program-erase count value $N_{PE}$ of the target memory block is checked. The program-erase count value $N_{PE}$ may be a value indicating how many times the program operation or the erase operation is performed after the semiconductor memory device 10 is manufactured. The program-erase count value $N_{PE}$ is determined for each memory block. Accordingly, the semiconductor memory device 10 may store the program-erase count value $N_{PE}$ of each of the memory blocks. In another embodiment, the memory controller may store each program-erase count value $N_{PE}$ of each memory block.

As a result of the determination of step S340, when the program-erase count value $N_{PE}$ is greater than the threshold value $N_{TH}$, this means that a relatively large number of program operations or erase operations are performed on the corresponding target memory block, which is the second memory block. Therefore, it is expected that a characteristic of the memory cells of the target memory block is deteriorated. Therefore, the target memory block is converted into the first memory block (S350). After step S350 is performed, the information identifying the first memory block and the second memory block may be updated.

As a result of the determination of step S340, when the program-erase count value $N_{PE}$ is not greater than the threshold value $N_{TH}$, this means that a relatively small number of program operations or erase operations are performed on the corresponding target memory block, which is the second memory block. Therefore, it is expected that the characteristic of the memory cells of the target memory block has not been deteriorated yet. Thus, the target memory block is maintained as the second memory block (S360).

Figure 16:
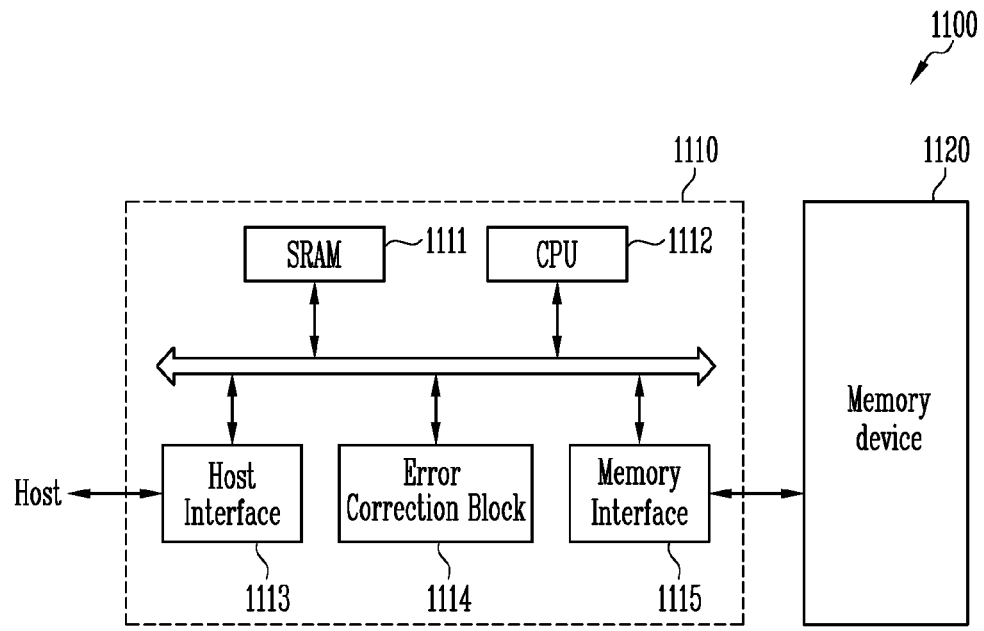
FIG. 16 is a block diagram illustrating a configuration of a memory system according to an embodiment.

FIG. 16 is a block diagram illustrating a configuration of a memory system 1100 according to an embodiment.

Referring to FIG. 16, the memory system 1100 includes a memory device 1120 and a memory controller 1110.

The memory device 1120 may be a multi-chip package configured of a plurality of flash memory chips. As an embodiment, the memory device 1120 may include a memory cell array, bit lines connected to the memory cell array, and a first upper line and a second upper line overlapping the bit lines and spaced apart from the bit lines by different distances.

The memory controller 1110 may be configured to control the memory device 1120, and may include a static random access memory (SRAM) 1111, a CPU 1112, a host interface 1113, an error correction block 1114, and a memory interface 1115. The SRAM 1111 is used as an operation memory of the CPU 1112, the CPU 1112 performs an overall control operation for data exchange of the memory controller 1110, and the host interface 1113 includes a data exchange protocol of a host connected to the memory system 1100. The error correction block 1114 detects and corrects an error included in data read from the memory device 1120. The memory interface 1115 performs interfacing with the memory device 1120. In addition, the memory controller 1110 may further include a read only memory (ROM) or the like that stores code data for interfacing with the host.

The above-described memory system 1100 may be a memory card or a solid state disk (SSD) in which the memory device 1120 and the memory controller 1110 are combined. For example, when the memory system 1100 is the SSD, the memory controller 1110 may communicate with the outside (for example, the host) through one of various interface protocols such as a universal serial bus (USB), a multimedia card (MMC), a peripheral component interconnection-express (PCI-E), a serial advanced technology attachment (SATA), a parallel advanced technology attachment (PATA), a small computer system interface (SCSI), an enhanced small disk interface (ESDI), and integrated drive electronics (IDE).

In an embodiment, information identifying whether each of the plurality of memory blocks in the memory device 1120 is the first memory block or the second memory block may be stored in the memory device 1120. In another embodiment, the information identifying whether each of the plurality of memory blocks is the first memory block or the second memory block may be stored in the memory controller 1110. In this case, the information may be stored in the SRAM 1111.

Figure 17:
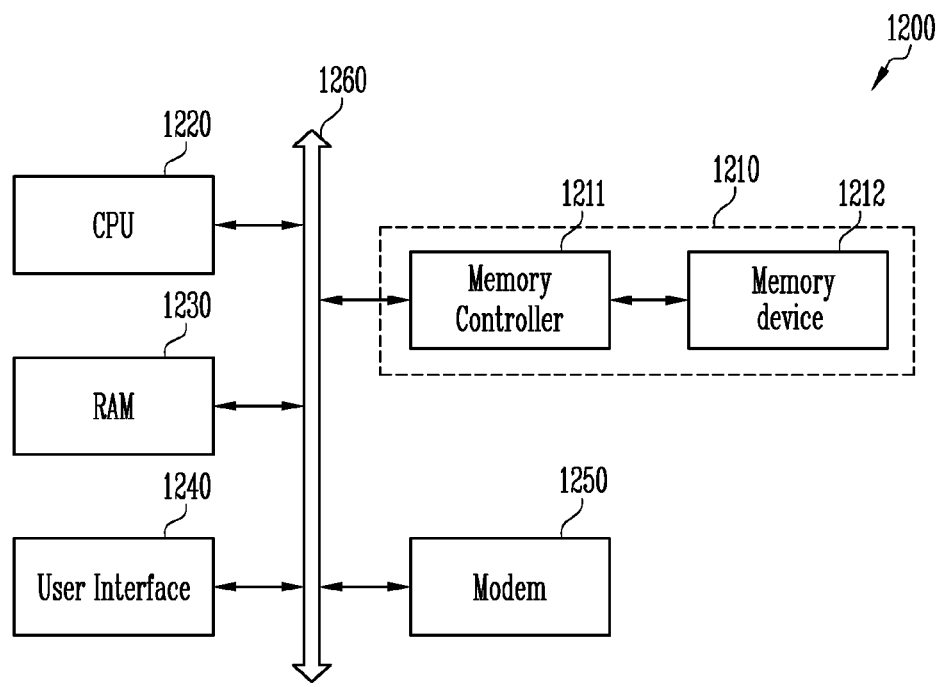
FIG. 17 is a block diagram illustrating a configuration of a computing system according to an embodiment.

FIG. 17 is a block diagram illustrating a configuration of a computing system 1200 according to an embodiment.

Referring to FIG. 17, the computing system 1200 may include a CPU 1220, a random access memory (RAM) 1230, a user interface 1240, a modem 1250, and a memory system 1210 electrically connected to a system bus 1260. When the computing system 1200 is a mobile device, a battery for supplying an operation voltage to the computing system 1200 may be further included, and an application chipset, a camera image processor (CIS), a mobile DRAM, and the like may be further included.

The memory system 1210 may include a memory device 1212 and a memory controller 1211. In an embodiment, the information identifying whether each of the plurality of memory blocks in the memory device 1212 is the first memory block or the second memory block may be stored in the memory device 1212. In another embodiment, the information identifying whether each of the plurality of memory blocks in the memory device 1212 is the first memory block or the second memory block may be stored in the memory controller 1211. In still another embodiment, the information identifying whether each of the plurality of memory blocks in the memory device 1212 is the first memory block or the second memory block may be stored in the memory system 1210. For example, the information may be stored in the RAM 1230 of the computing system 1200.

What is claimed is:

1. A semiconductor memory device comprising:
a plurality of memory blocks sequentially disposed in a first direction, the plurality of memory blocks each including a plurality of memory cells; and
a contact region formed between the plurality of memory blocks,
wherein a first memory block that is not adjacent to the contact region and a second memory block adjacent to the contact region among the plurality of memory blocks operate based on different operation parameters, and
wherein the first memory block that is not adjacent to the contact region is adjacent to two memory blocks.

2. The semiconductor memory device of claim 1, further comprising:
a bit line positioned on the plurality of memory blocks and the contact region; and
a logic circuit positioned under the plurality of memory blocks and the contact region.

3. The semiconductor memory device of claim 2, wherein the logic circuit includes a peripheral circuit that performs an operation on a selected memory block among the plurality of memory blocks, and the peripheral circuit uses a first parameter during the operation when the selected memory block is the first memory block, and uses a second parameter different from the first parameter during the operation when the selected memory block is the second memory block.

4. The semiconductor memory device of claim 3, wherein the operation is a program operation, and
the first parameter and the second parameter indicate a voltage value used in the program operation of the selected memory block.

5. The semiconductor memory device of claim 3, wherein the operation is a read operation, and
the first parameter and the second parameter indicate a voltage value used in the read operation of the selected memory block.

6. The semiconductor memory device of claim 3, wherein the operation is an erase operation, and
the first parameter and the second parameter indicate a voltage value used in the erase operation of the selected memory block.

7. The semiconductor memory device of claim 1, wherein user data is stored in the first memory block and system data is stored in the second memory block.

8. The semiconductor memory device of claim 7, wherein the system data includes a parameter used in an operation on the plurality of memory blocks.

9. The semiconductor memory device of claim 7, wherein the system data includes any one of a boot code, meta data, mapping data, or parity data.

10. The semiconductor memory device of claim 1, wherein N bit is stored in each of the memory cells included in the first memory block, and M bits are stored in each of the memory cells included in the second memory block, and
wherein N is a natural number greater than 0, and M is a natural number greater than the N.

11. The semiconductor memory device of claim 1, wherein N bits are stored in each of the memory cells included in the first memory block, and M bit is stored in each of the memory cells included in the second memory block, and
wherein M is a natural number greater than 0, and the N is a natural number greater than the M.

12. The semiconductor memory device of claim 1, wherein when a program-erase count value of the second memory block exceeds a predetermined threshold value, the second memory block is operated using the same operation parameters as the first memory block.

13. A semiconductor memory device comprising:
a plurality of memory blocks sequentially disposed in a first direction, the plurality of memory blocks each including a plurality of memory cells; and
a contact region formed between the plurality of memory blocks,
wherein a first operation parameter is used for a first operation on a first memory block that is spaced apart from the contact region, and a second operation parameter is used for a second operation on a second memory block adjacent to the contact region, and wherein the first operation parameter is different from the second operation parameter, and the first and second operations are the same, and
wherein the first memory block that is spaced apart from the contact region is adjacent to two memory blocks.

14. The semiconductor memory device of claim 13, wherein the first and second operations are at least one of a read operation, erase operation, and program operation.

* * * * *